United States Patent [19]

Abbondanti

[11] Patent Number: 4,520,298

[45] Date of Patent: May 28, 1985

[54] METHOD AND APPARATUS FOR SAMPLING OUTPUT AC CURRENTS IN A VOLTAGE-FED INVERTER POWER SUPPLY

[75] Inventor: Alberto Abbondanti, Penn Hills, Pa.

[73] Assignee: Westinghouse Electric Corp., Pittsburgh, Pa.

[21] Appl. No.: 596,332

[22] Filed: Apr. 3, 1984

[51] Int. Cl.³ .......................... G01R 19/00; H02P 5/40
[52] U.S. Cl. .................................... 318/490; 318/805; 318/811
[58] Field of Search ............... 318/800, 801, 803, 805, 318/811, 490, 807–810; 324/158 MG; 363/41, 136

[56] References Cited

U.S. PATENT DOCUMENTS 4,351,022  9/1982  Dolland et al. ............... 318/803
4,394,610  7/1983  Dolland ....................... 318/803

Primary Examiner—David Smith, Jr.
Attorney, Agent, or Firm—C. M. Lorin

[57] ABSTRACT

In a voltage-source inverter AC power supply, the AC currents are measured exclusively by sampling the DC current in the DC link between voltage-source and inverter. Each sample so derived is correlated to the status of the switches in the inverter at the instant of sampling, or before and after a change in the switching status of the inverter. This technique applies more generally to pulse-width modulation applications, but also to an adjustable voltage input (AVI) inverter motor drive.

23 Claims, 19 Drawing Figures

METHOD AND APPARATUS FOR SAMPLING OUTPUT AC CURRENTS IN A VOLTAGE-FED INVERTER POWER SUPPLY

BACKGROUND OF THE INVENTION

The invention relates to voltage-source inverter power supply in general, and more particularly to a pulse-width modulated AC motor drive having such a power supply.

In any AC power supply it is necessary to ascertain the magnitude of the AC currents in each phase. This is done usually with current sensors. This is also the case with an AC motor drive.

The control circuit of an ac motor drive in general uses information with regard to the level of motor current mover in order to perform certain regulating functions under motor operation, such as: torque control, current limit, flux regulation, etc. Current information is usually obtained through current sensors inserted in series with the motor lines. At least two such sensors are required, which must be capable of delivering undistorted signals at very low frequencies, including DC. These sensors must also provide isolation between the control circuits and the power lines. Because of the low frequency requirements, transformers are not applicable. Because of the isolation requirements, direct sensing via shunts is not practical. As a result, sensing current as done in the prior art always necessitates circuit having complexity and it entails both a cost penalty and an impairment of the reliability of the system. Solutions have been proposed which consist in using either transducers based on Hall effect devices, or chopper-stabilized isolation amplifiers. It is known that either of these solutions adversely affect the cost of the controls and their reliability, as compared, for instance, to transformer-based current sensing.

In the case of a voltage-source inverter AC motor drive, a current sensor is also used in the DC link. This sensor provides information regarding the magnitude of the DC link current. This information is supplied to the control circuit for regulation and protection purposes with respect to the inverter, or at the front end where the DC source is. Such a DC current sensor has also bandwidth and isolation requirements, like the aforementioned AC current sensors, and the implementation in the prior art adpots solutions which are similar to those mentioned hereabove.

SUMMARY OF THE INVENTION

The present invention provides a solution to the problem of ascertaining AC currents in an AC power supply where the AC currents are generated as a result of control of an inverter coupled to a DC voltage source.

In such a situation, the invention takes advantage of the fact that the DC current flowing in the DC link between voltage source and inverter, at any moment that the power switches in the inverter assume a certain ON or OFF status according to the switch control sequence, contains information regarding the generated AC currents.

Accordingly, it is proposed to use a DC current sensor in the DC link and to sample the output of such DC current in correlation with the power switches switching pattern so as to derive samples which are characteristic of the outputted AC currents.

The invention also resides in using a mere AC transformer with such DC link, provided the sampling time intervals are properly correlated with specific switching status among the power switches of the inverter.

In addition, the invention allows the use of an AC transformer in correlation with the switching status assumed by the power switches in the switching pattern, with the provision of a DC restorer circuit activated whenever information regarding the DC component in the DC link is required to derive an AC current representative sample.

DESCRIPTION OF THE PREFERRED EMBODIMENTS

Figure 1:
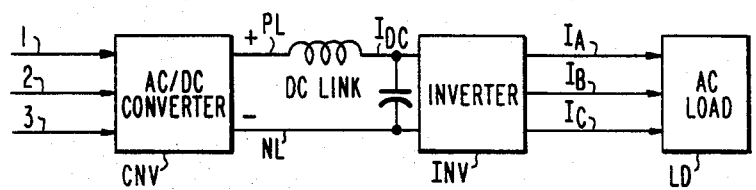
FIG. 1 is a block diagram of a voltage source inverter AC power supply.

Referring to FIG. 1, an AC load is supplied with alternating currents $I_A$, $I_B$, $I_C$ from a inverter INV connected to a voltage DC source through a DC link comprising terminals of opposite polarities (PL, NL) and a filter capacitor. The DC source in general is obtained with a rectifier RCT, or an AC/DC converter, supplied with AC power from supply lines 1, 2, 3. A DC current $I_{DC}$ flows in the DC link.

Figure 2:
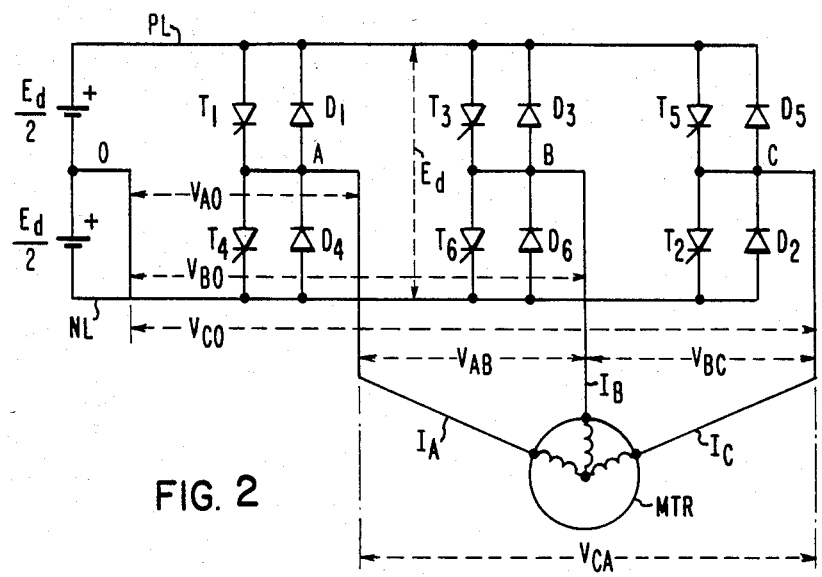
FIG. 2 illustratively shows a three-phase thyristor bridge as part of the inverter of FIG. 1 and an induction motor associated thereto.

FIG. 2, illustratively shows the inverter as an inverter-bridge and an induction motor as the AC load. The DC source is symbolized by two batteries connected in series between the two terminals (PL, NL), each battery being of half the DC link input voltage $E_d$. The inverter bridge includes thyristors $T_1$–$T_6$ connected by pairs in series between the DC link terminals (PL, NL), with a common node in each pair associated with a corresponding one of the three phases A, B, C of the motor MTR. Free-wheeling diodes $D_1$–$D_6$ are associated with the respective thyristors.

Figure 3:
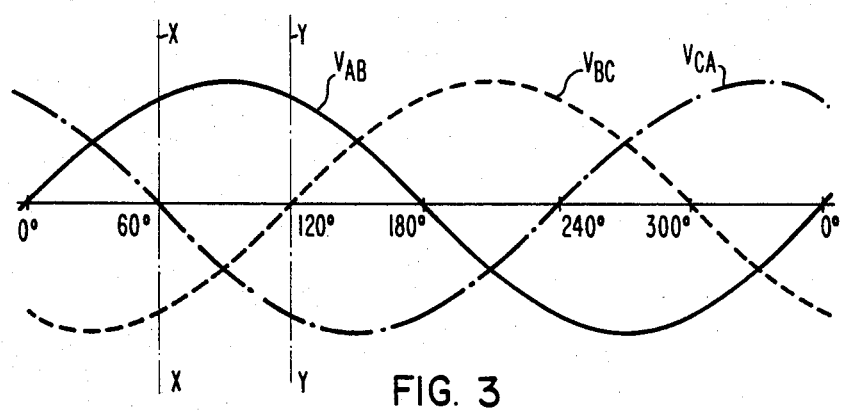
FIG. 3 typically shows the fundamental component of the voltage input of the induction motor of FIG. 2.

FIG. 3 shows the time relationship between the fundamental components of the interphase voltages $V_{AB}$, $V_{BC}$ and $V_{CA}$ of the motor. FIGS. 1, 2 and 3 are prior art.

The invention will be described illustratively in the context of a pulse-width modulated motor drive which is the preferred embodiment, thereby to demonstrate the improvement in cost and reliability resulting from the chosen approach to sensing current in the DC link for the purpose of ascertaining the outputted AC currents.

Figure 4:
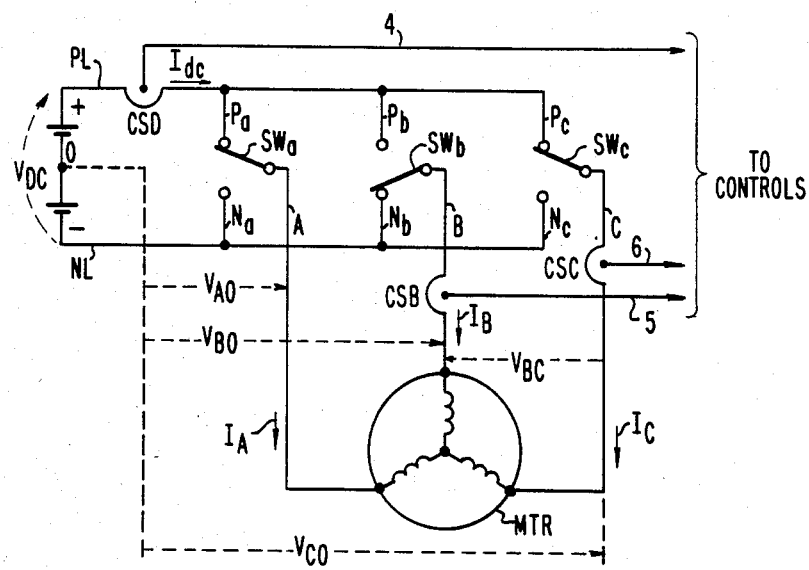
FIG. 4 is a schematic circuit representation with the currents and voltages involved for the relative positions of the switches of FIG. 2 between the three phases of the load, in a pulse-width modulation (PWM) motor drive.

Referring to FIG. 4, a PWM motor drive is showed, reduced to the essential including: a voltage source $V_{DC}$ having a positive terminal PL and a negative terminal NL and an inverter-bridge symbolized by three single-pole double-throw switches, one per inverter "pole". These switches $SW_a$, $SW_b$, $SW_c$ are connecting the respective phase lines A, B, C of an induction motor MTR to either one of the two polarity lines, via position contacts ($P_a$, $N_a$), ($P_b$, $N_b$), ($P_c$, $N_c$). On FIG. 4, lines A and C are shown connected to the positive terminal, line B to the negative terminal. Control of such PWM motor drive involved in the past the derivation with a DC current sensor CSD of a signal representation of the DC link current $I_{DC}$ (via line 4) and of at least two signals representative of the AC currents, typically $i_b$ for $I_B$ with an AC current sensor CSB for phase B and similarly CSC for phase C from line 5 and 6, respectively. It will be shown that when using only the DC current sensor CSD it is possible to know the value of the AC currents in the motor lines by properly manipulating information derived from the DC current sensor in correlation with the conduction status of the switches $SW_a$, $SW_b$, $SW_c$. Especially where control of the motor drive is microprocessor-based, and where PWM modulation is implemented directly with a microprocessor, such derivation of information and correlation thereof becomes straightforward. It amounts to sampling the DC link current at precise time intervals established in correlation with a known switch status, and to deriving such samples in accordance with such correlation. Thus, the two AC current sensors CSB, CSC can be eliminated with a consequent cost and reliability improvement.

It will also be shown that sampling and sample correlation with the DC current sensor can be done in such a manner that the DC current sensor itself can be reduced to a mere current transformer, thereby providing further cost and reliability improvements.

Figure 5A:
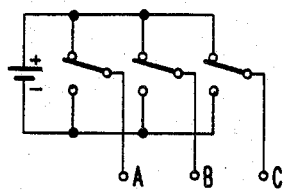
FIGS. 5A–5H show the eight possible configurations of the switches of FIG. 2 and FIG. 3 in relation to the phase lines and the DC terminals.
Figure 5B:
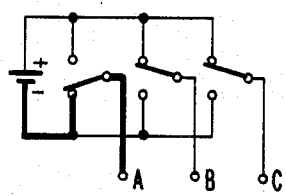
Figure 5C:
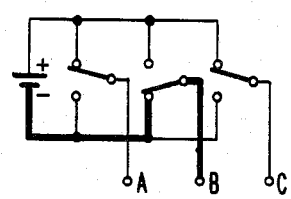
Figure 5D:
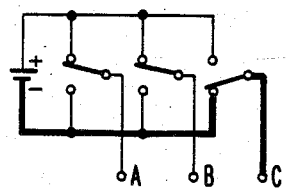
Figure 5E:
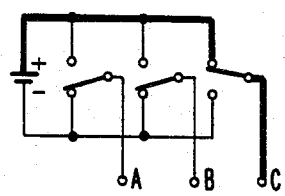
Figure 5F:
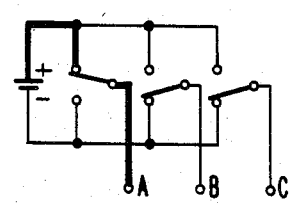
Figure 5G:
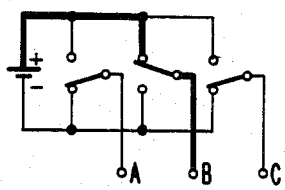
Figure 5H:
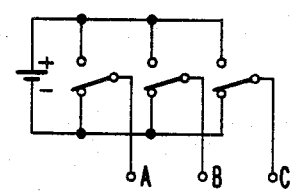

Most 3-phase PWM inverters can be represented by a set of three single-pole double-throw switches, like $SW_a$, $SW_b$ and $SW_c$ on FIG. 4. These switches can connect any one of three output (motor) lines A, B, C, either to the positive, or the negative terminal of the DC source $V_{DC}$. The switches are activated according to carefully chosen rules defined as the "modulation policy", intended to produce, across the load, periodic AC voltages having desired values of fundamental frequency and voltage and reduced values of undesirable but unavoidable harmonic components. However complex such modulation policy is, there are only eight possible configurations that the set of three switches $SW_a$, $SW_b$, $SW_c$ can assume. These configurations correspond to only eight possible conduction states for the set of 3 inverter poles. Such eight possible states (1 to 8) are shown by FIGS. 5A-5H. From these figures it appears that a given motor line, such as A in FIG. 5B, can be at times the only one connected to one of the terminals of the DC source. For the sake of clarity, in such a case, the line is said to be "sole-connected". Thus, line A is sole-connected in states (2) and (6) (FIGS. 5B and 5F). When it is not "sole-connected", the motor line is connected to one DC terminal in common with one or two other motor lines. In that case, the motor line is said to be "co-connected". It is seen that in any one given state, there is either one line which is sole-connected, or they are all co-connected. In fact, in only two instances (states 1 and 8 of FIGS. 5A and 5H) are the lines "all co-connected" (with the positive terminal in the first instance and with the negative terminal in the second instance).

With a microprocessor-based motor drive, it is readily known at any given time which motor line is "sole-connected" and to which DC terminal. This information is available from the microprocessor at any time through conventional memory inspection processes. Similarly, at any instant immediately preceeding the activation of any switch, intelligence is provided as to the next line to become "sole-connected" after switching.

The following observations can be made by reference to FIG. 4 in the light of the eight configurations of FIGS. 5A-5H:

1. At any given instant, if one of the motor lines is sole-connected, the DC link current level happens to represent the motor current level in that motor line. For instance, in FIG. 4 where line B is sole-connected, the DC link current $I_{DC}$ flows through branches $P_a$ and $P_c$ into lines A and C of the motor. The split of $I_{dc}$ occurring between those two paths is in general unequal and undetermined, since there may be an unknown circulating current free-wheeling through lines A and C. It is observed, however, that current $I_{DC}$ re-emerges as a whole from the motor via line B, and only line B, as it returns to the negative terminal NL of the DC source via branch $N_b$.

2. With the sign relationship indicated on FIG. 4, it is further observed that the motor line current is represented both in magnitude and sign by the DC link current when that motor line is sole-connected to the positive DC link terminal, whereas if a line happens to be sole-connected to the negative DC link terminal, the DC link current still represents in magnitude the motor current in that line, but the polarity is reversed.

3. A third observation is that at the time one of the three switches toggles, the DC link current undergoes a step which represents in magnitude the current level in the motor line corresponding to the switch which has just toggled. The reason for this behavior is that the motor can be viewed as a purely inductive load for the fast transient, i.e. a constant current "sink". The sign of such motor line current is the same as the sign of the step, if the toggling goes from the (−) DC link terminal to the (+) DC link terminal; otherwise, the polarity of the motor current in the toggling line is opposite to the sign of the step. A step is considered positive if it results in an increase of positive current.

4. Finally, when all lines are co-connected, the DC link current is zero in magnitude, whatever the values of the motor currents.

From these observations it appears that it is feasible to derive precise information regarding all three of the motor line currents, by "reading" and "interpreting" the output of a single DC-side current sensor, such as CSD in FIG. 4, thereby eliminating the necessity of using AC-side sensors, such as CSB, CSC in FIG. 4.

There are several ways of implementing the invention:

a. In a first mode, sampling of the output of the DC current sensor can be performed randomly, or periodically in synchronism with the modulation carrier. It can be done periodically or asynchronously with the modulation carrier. Upon each sampling step, the conduction states of the three poles are examined and it is determined which of the output lines is "sole-connected". The magnitude of the sample is derived for that line, with, or without, sign reversal (depending upon whether the sole-connection makes contact to the negative, or the positive DC bus). The succession of samples so derived and assigned to a particular line, represents the evolution in time of the AC motor current for that line. In the situation where sampling occurs when all three lines are co-connected, the sampled value is merely ignored.

b. In a second mode, sampling of the output of the DC current sensor is derived in conjunction with each occurrence of a single switching event. Then, the step in the sensed value occurring at the output of sensor CSD is ascertained simultaneously with such switching event. To this effect, the output of sensor CSD is "read" immediately before, then again immediately after such switching and the difference between these two successive readings is established in relation to the intervening switching event. Such difference defines the step in magnitude occurring upon the switching event. It will be either positive, or negative. This step measured as a difference represents in magnitude the instantaneous current in the motor line associated with the pole upon which such switching occurs e.g. the switching occurrence between two sampling readings which took place. In addition, according to the sign rule applicable in this sampling mode, if after switching the motor line is connected to the (+) DC terminal, the sign of the motor line should be made the same as the sign of the step. Otherwise, the sign of the motor line current should be made of the opposite sign with regard to the measured step.

c. It is observed that the procedure followed under mode #2 relies only on the measurement of a step e.g. a change of magnitude occurring at the output of sensor CSD. Therefore, such sensor need not have DC response capability, nor a low frequency response accuracy quality. In fact, the method under mode #2 can be performed with the aid of a current transformer, rather than a DC current sensor. Even, a simple transformer of ordinary design would be suitable as a substitute for the conventional DC sensor CSD. This results in cost and reliability advantages, as opposed to the prior art using wideband current transducers.

d. The previous approaches to implementation are adequate to ascertain, at any sampling moment, the value of the current in one of the motor lines. However, it is often necessary to know the instantaneous value of the currents in all three motor lines simultaneously.

This is the case if it is desired to know at any sampling instant the common amplitude $I_m$ of the three following sinusoids:

$$I_A = I_m \sin(\omega t)$$

$$I_B = I_m \sin(\omega t - 120°)$$

$$I_C = I_m \sin(\omega t - 240°) \quad (1)$$

where $I_A$, $I_B$ and $I_C$ are the three fundamental motor currents of FIG. 4.

The common amplitude $I_m$ may be required for current limiting purposes. It can be obtained without having to detect when any one of the AC currents is cresting and without having to wait until such a crest occurs. To this effect, it is sufficient to acquire at any instant and simultaneously, the three sampled values $i_a$, $i_b$ and $i_c$ representing the AC motor currents, then, to recognize that elementary trigonometric relations applied to equations (1) yield:

$$I_m^2 = 2(I_A^2 + I_b^2 + I_c^2)/3$$

To achieve this, the following method is proposed:

When neither the present pole conduction state, nor the oncoming one, are such that all motor lines are co-connected, the output of sensor CSD is read immediately before the switching event, then read again immediately after such switching event. These two consecutive readings are assigned respectively to the motor line that was sole-connected before the switching and to the one that appears to be sole-connected after the switching, the afore-mentioned sign rule being applied. Next, the sum of the signed readings is effected and the sign is changed, the result being assigned to the third motor line. Inasmuch as the interval between two such consecutive readings can be made sufficiently short, these three consecutive determinations can be considered as simultaneous in practice.

e. The methods of items (a.) and (d.) hereabove require DC and low frequency transfer capability from the current sensing element CSD. This apparently rules out the use of a simple and economical current transformer. However, a current transformer can be used even then, provided the existing correlation between the values of the DC link current and the conduction states of the poles is taken into consideration. As a matter of fact, when all motor lines are co-connected, the DC link current by necessity is zero.

Figure 7:
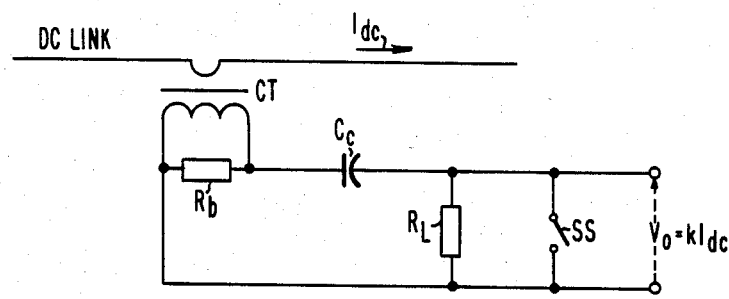
FIG. 7 is a DC restorer circuit as can be used in accordance with the invention.

At this point, reference should be had to "Pulse, Digital and Switching Waveforms" by Jacob Millman and Herbert Taub, a book published by McGraw-Hill Book Company in 1965, where the difinition of a DC restorer is given. In particular, on pages 278–281 of the book, it is explained how short-circuiting the output line of a DC restorer when the input signal is zero will allow the capacitor in circuit to acquire, or lose, enough charge to bring about the output level for the restorer at the level of the DC reference signal non-translated by the AC transformer. Referring to FIG. 7, a DC restorer is shown associated with the transformer CT substituted for the conventional current sensor CSD of FIG. 4.

Current transformer CT feeds a burden resistor $R_b$. A coupling capacitor $C_c$ applies the derived signal to a load resistor $R_L$. A solid-state switch SS is activated upon each conduction state for which all lines are co-connected. Switch SS is held closed for a duration one order of magnitude larger than the time constant $R_bC_c$. This clamps the output $V_o$ to zero at the time $I_{dc}$ is known to be itself zero. During such clamping, $C_c$ charges up with a voltage that offsets, in the response of transformer CT, the erroneous component due to the transformer inability to transfer DC and low frequency signals. Provided switch SS is activated often enough, transformer CT needs only to be accurate in transferring the detected steps and the rapid variations of the signal, whereas the low frequency distortion is accurately compensated by the constant updating of the DC voltage across $C_c$. The resulting output voltage $V_o$ is proportional to $I_C$ much as if current sensor CSD were a complex isolated wideband transducer instead of a simple current transformer as is made available by the present invention. This is possible because of the modulation method introducing states such as (1) or (8) of FIGS. 5A, 5F, which states correspond to an "all coconnected" status.

Figure 6:
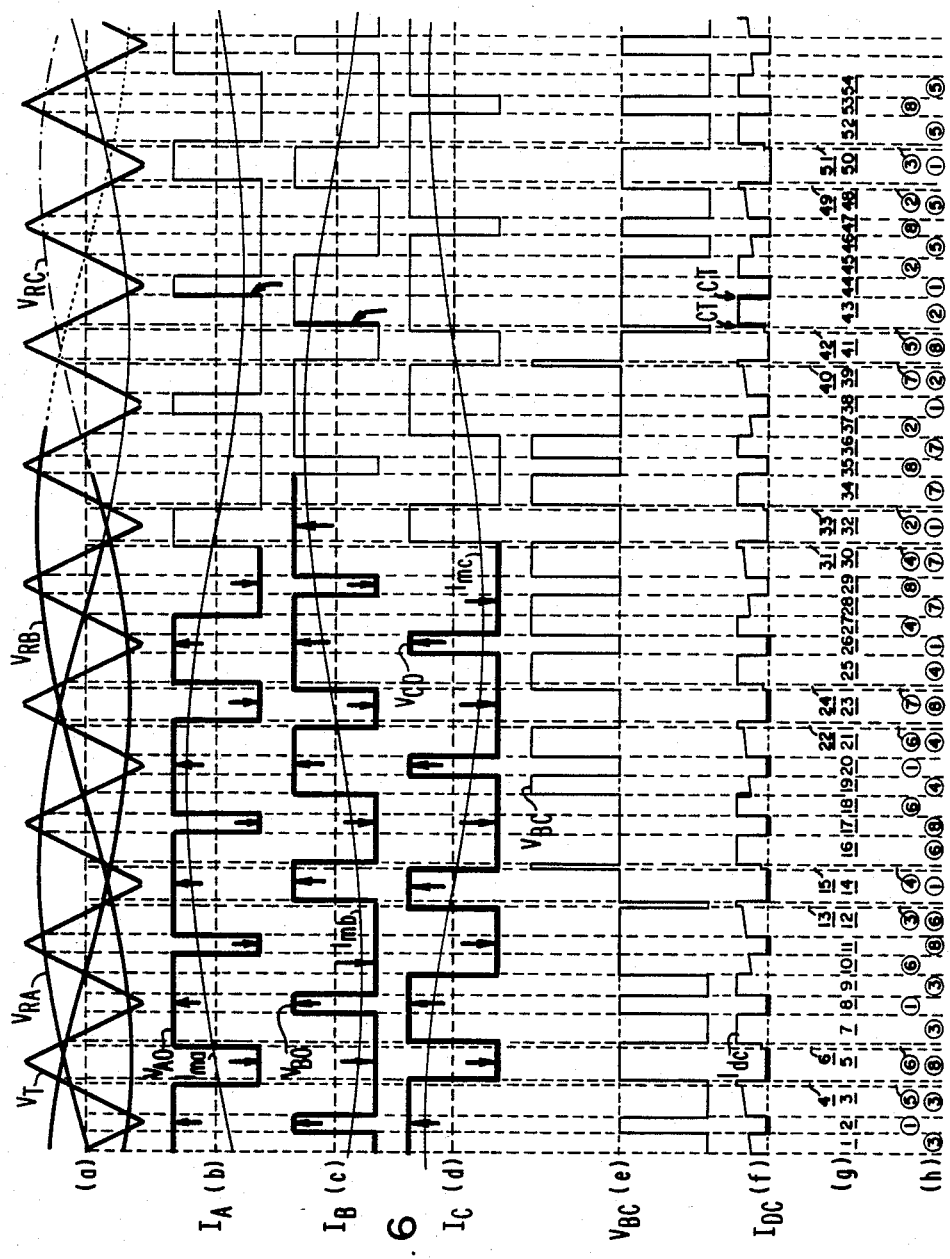
FIG. 6 is a chart of curves illustrating DC current sampling method according to the invention.

In order to illustrate the invention in practice, reference is made to FIG. 6 which illustrates with curves the operation of an AC power supply using PWM modulation known as "triangle interception", or "subharmonic method", or "natural sampling".

Curves (a) show a triangular timing wave $V_T$ and three time wave reference sinusoids $V_{RA}$, $V_{RB}$ and $V_{RC}$. In the example the ratio of the "carrier" frequency (the frequency of $V_T$) to the fundamental output frequency is 9 to 1. The amplitude of the reference waves is such that the output fundamental voltage of the inverter would be about 60% of maximum. In an industrial drive with a 60 Hz motor, this situation would correspond to operation at about 35 Hz motor fundamental frequency. The corresponding switching frequency of a given pole is 9 times the fundamental, i.e. 315 Hz, which is close to the limit for a typical thyristor drive, A drive using GTO thyristors would accomodate higher switching frequencies.

Interception of the sinusoids by the triangular timing wave causes switchings of power switches with respect to a corresponding pole. The resulting pole output waves, referred to the mid-point of the DC supply (node 0 on FIG. 4), are shown by curves (b), (c) and (d) which represent the pole-to-DC-neutral voltages $V_{AO}$, $V_{BO}$ and $V_{CO}$ of the motor lines.

Superimposed on these voltages are sinusoids $I_A$, $I_B$ and $I_C$ which represent the fundamentals of the motor line currents. In reality, harmonic components exist that transform the sinusoids into jagged contour waves of general sinusoidal aspect. These harmonics, however, can be ignored here, for the sake of simplicity. The current sinusoids are shown lagging by 30° with respect to the respective pole fundamental voltages, thereby reflecting a motor power factor of 0.867.

Curve (e) shows the line-to-line voltage $V_{BC}$ Curve (f) shows the DC link current $I_{dc}$ which is drawn in the DC link, again neglecting the motor harmonics. Currents $i_A$, $i_B$, $i_C$ representing $I_A$, $I_B$, $I_C$ are sampled during each of the time intervals (1 to 54 for one period, in FIG. 6) which define a step in the current $I_{DC}$, in accordance with curves (b), (c) and (d).

(g) indicates the various intervals determined by the triangle interceptions as delineated by vertical dotted lines. They are identified from 1 to 54 across one period. On the last line (h), the circled numbers represent the conduction state of the poles in each interval, in accordance with the succession of states illustrated on FIG. 5A-5H. Each of the 8 possible states is repeated 6 times per period, except for states (1) and (8), which occur 9 times each.

For instance, at interval 10, motor line A is sole-connected to the (+) terminal of the DC link, and the DC link current profile shown under (f) duplicates the motor current $I_A$ shown under (b) during such interval, as shown by the identical shaded areas. The same occurs at intervals 6, 12, 16, 18 and 22. At interval 21, motor line C is sole-connected to the (−) terminal of the DC link, and by comparing the shaded areas of $I_{DC}$ and $I_C$ it is seen that $I_{DC}$ under (f) duplicates AC current $I_C$ under (d) for the same portion through the interval, except that the polarity is reversed. The same occurs at intervals 15, 19, 25, 27 and 31. Therefore, by sampling the levels of $I_{DC}$ each at a proper instant, while adopting a proper correlation to the pole conduction states, each motor line current can be sampled 12 times per period.

At the beginning of interval 43, FIG. 6 shows a step in $I_{DC}$ which has been marked for identification by a double-pointed arrow. Since motor line B had switched at that moment, as shown on the $V_{BO}$ trace, the magnitude of the step represents the value of $I_B$ at the switching instant, as shown by a double-pointed arrow under (c) for the same time interval 43. The step occurring in $I_{DC}$ is positive, and the switching goes from (−) to (+). The step is an indication of the magnitude of $I_A$, which is to be taken with the negative sign, as shown by dotted double-pointed arrows. It can be ssen that by measuring the steps of $I_{DC}$, with a proper corrrelation to the switching poles, each motor line current can be sampled 18 times per period. Since information regarding the size and sign of the steps in $I_{DC}$ is the only necessary one, a current transformer is adequate to provide the sensing, instead of a wideband isolated transducer as used in the prior art. It should be noted that level sensing and step sensing can be combined to provide up to 30 discrete samples of the current in each motor line per fundamental period.

At the boundary between intervals 18 and 19, $I_{DC}$ undergoes a step without there being a zero level, neither before, nor after the step. This affords an opportunity of sampling all three motor currents simultaneously. To this effect, sampling immediately before the boundary, provides the measure of $I_A$, since motor line A, then, is sole-connected to the (+) terminal, whereas sampling immediately after the boundary, provides the measure of $-I_C$, since motor line C becomes sole-connected to the (−) terminal. The sum of these two determinations (i.e. $-[I_A+I_C]$), affected with a negative sign, yields $I_B$. There are 18 opportunities per period of performing such simultaneous sampling.

There are also 18 intervals for which $I_{DC}$ is at the level zero, e.g., when all motor lines are co-connected. These intervals occur in coincidence with the positive and negative crests of the triangular wave on line (a). During such intervals, no determination of the motor currents is possible as they free-wheel in the motor without involting the DC link. However, at each of these intervals, the DC restorer switch SS (FIG. 6) is activated to clamp the output $V_o$ to zero. The large number of DC restorations that can be performed per cycle allows the current transformer CT to have poor low frequency transfer performance, i.e. to be of ordinary design.

Figure 8:
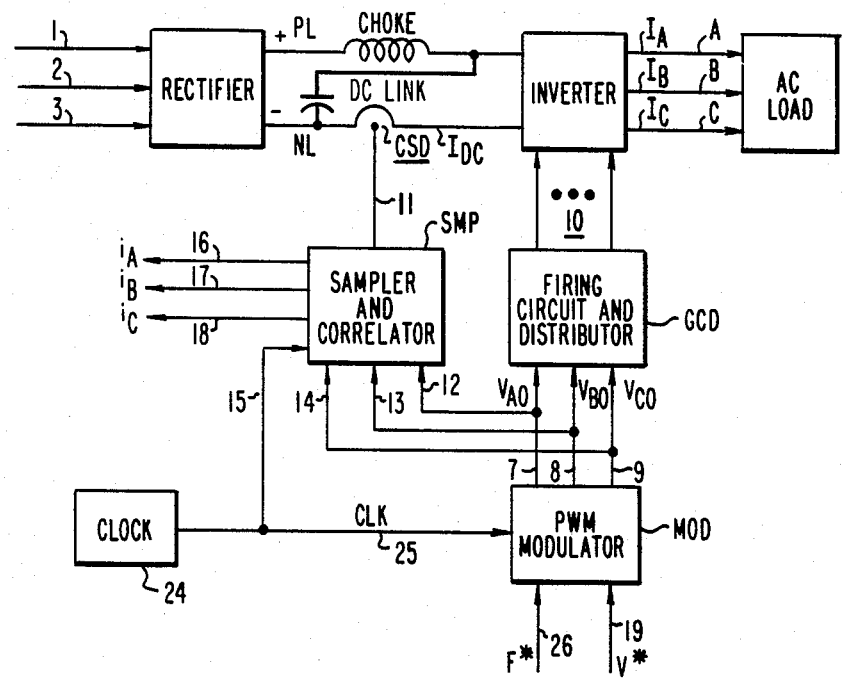
FIG. 8 is a block diagram illustrating one embodiment of the invention in accordance with a first mode of implementation.

Referring to FIG. 8, a way of implementing the afore-mentioned mode #1 of sampling $I_{DC}$ with a direct current sensor, like CSD on the DC link, is illustrated. As generally known a pulse-width modulator MOD is shown responsive to a clock signal CLK on line 25 from a clock 24, to a frequency reference signal F* on line 26 and to a voltage reference signal V*, on line 19. Modulator MOD outputs on lines 7, 8 and 9 pulse width modulated voltage waves $V_{AO}$, $V_{BO}$ and $V_{CO}$, like shown under (b), (c) and (d) in FIG. 6. A firing circuit and distributor GCD gates sequentially the static switches of the inverter INV, via lines 10.

According to the present invention, current sensor CSD provides on line 11 a direct current signal representing the magnitude of $I_{DC}$ in the DC link, instantaneously. A sampler and correlator circuit SMP selects at predetermined instants successive samples of the sensed value of $I_{DC}$ and each sample so derived is related to one of the three phases in accordance with the states of the three lines 7, 8 and 9, as translated by respective lines 12, 13, 14 into circuit SMP. Clock 24 establishes by line 15 the sampling instants, which can be either synchronously, or asynchronously, occurring, as earlier stated in accordance with mode #1 of implementation. Depending upon the particular correlation between lines 12, 13, 14 and the sampling instant, the sample so derived represents $I_A$, $I_B$ or $I_C$. Samples $i_A$, $i_B$ and $i_C$ related to the correct motor line are outputted by circuit SMP on lines 16, 17 and 18, respectively.

Figure 9:
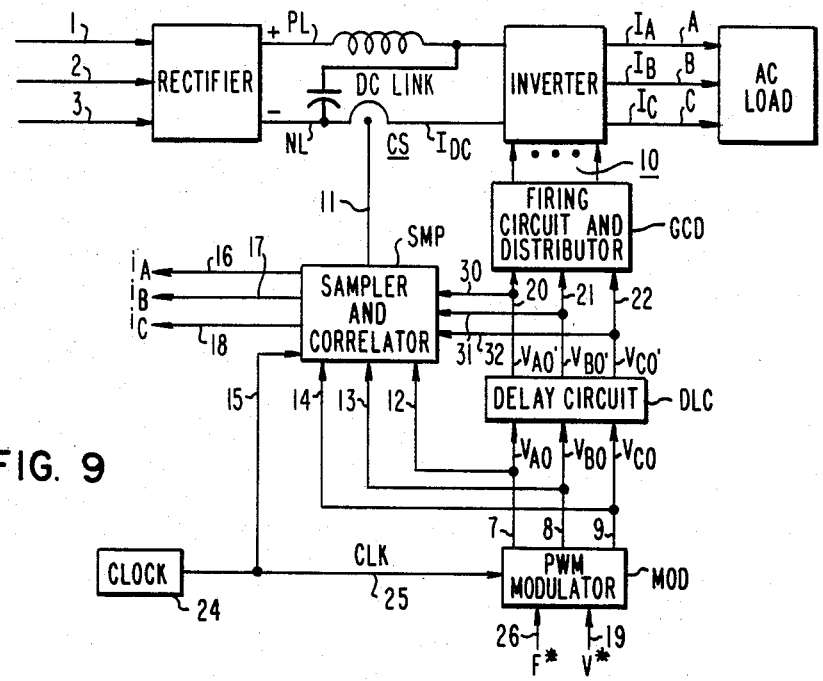
FIG. 9 is a block diagram illustrating another embodiment of the invention in accordance with a second mode of implementation.

Referring to FIG. 9, the second mode of implementation is illustrated by a block diagram differing from the block diagram of FIG. 8 in that the three voltage waves $V_{AO}$, $V_{BO}$, $V_{CO}$ at the output of the pulse width modulator MOD are passed through a delay circuit DLC before being inputted by lines 20, 21, 22 into the firing circuit and distributor GCD as gating voltages $V_{AO}'$, $V_{BO}'$ and $V_{CO}'$. The sampler and correlator circuit SMP is responsive to lines 12, 13, 14 from lines 7, 8 and 9 and to lines 30, 31, 32 from lines 20, 21 and 22. As previously stated, the sampling instant immediately precedes, or follows, the switching event for a particular switching device. Sampling occurs with regard to the state of lines 12, 13 and 14 and, after a delay, occurs again with regard to the state of lines 30, 31, 32, while switching occurs within the time interval so defined. The sampler and correlator stores the values of the sample upon each sampling instance and effectuates a subtraction between two consecutive samples as explained earlier, regarding mode #2, thereby to derive $i_A$, $i_B$ or $i_C$.

In each case, the sampler and correlator SMP of FIG. 8 or of FIG. 9, applies the sign rule illustrated hereinbefore by reference to the samples of lines (f), (g) with the numerical characterization under (h) in FIG. 6.

In Tables I and II herebelow are shown twenty time intervals representing successive configurations for $V_{AO}$, $V_{BO}$, $V_{CO}$ as numbered from one to twenty under (g) in FIG. 6.

TABLE I

Mode #1
Time Interval

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $V_{AO}$ | 1 | 1 | 1 | 0 | 0 | 1 | 1 | 1 | 1 | 1 | 0 | 1 | 1 | 1 | 1 | 1 | 0 | 1 | 1 | 1 |
| $V_{BO}$ | 0 | 1 | 0 | 0 | 0 | 0 | 0 | 1 | 0 | 0 | 0 | 0 | 0 | 1 | 1 | 0 | 0 | 0 | 1 | 1 |
| $V_{CO}$ | 1 | 1 | 1 | 1 | 0 | 0 | 1 | 1 | 1 | 0 | 0 | 0 | 1 | 1 | 0 | 0 | 0 | 0 | 0 | 1 |
| Samples | $i_1$ | $i_2$ | $i_3$ | $i_4$ | $i_5$ | $i_6$ | $i_7$ | $i_8$ | $i_9$ | $i_{10}$ | $i_{11}$ | $i_{12}$ | $i_{13}$ | $i_{14}$ | $i_{15}$ | $i_{16}$ | $i_{17}$ | $i_{18}$ | $i_{19}$ | $i_{20}$ |
| Sign of Sample | − | | − | + | | + | − | | − | + | | + | − | | − | + | | + | + | − |

As Allocated

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $i_A$ l.16 | | | | | | $\|i_6\|$ | | | | $\|i_{10}\|$ | | $\|i_{12}\|$ | | | | $\|i_{16}\|$ | | $\|i_{18}\|$ | | |
| $i_B$ l.17 | $-\|i_1\|$ | | $-\|i_3\|$ | | | | $-\|i_7\|$ | | $-\|i_9\|$ | | | | $-\|i_{13}\|$ | | | | | | $-\|i_{19}\|$ | |
| $i_C$ l.18 | | | | $\|i_4\|$ | | | | | | | | | | | $-\|i_{15}\|$ | | | | | |

TABLE II

Mode #2
Time Interval

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $V_{AO}$ | 1 | 1 | 1↘0 | 0↗1 | 1 | 1 | 1 | 1↘0↗1 | 1 | 1 | 1 | 1↘0↗1 | 1 | 1 | | | | | | |
| $V_{BO}$ | 0↗1↘0 | 0 | 0 | 0 | 0↗1↘0 | 0 | 0 | 0 | 0↗1 | 1↘0 | 0 | 0↗1 | 1 | | | | | | | |
| $V_{CO}$ | 1 | 1 | 1 | 1↘0 | 0↗1 | 1 | 1↘0 | 0 | 0↗1 | 1↘0 | 0 | 0 | 0 | 0↗1 | | | | | | |

Samples
$i_1$ $i_2$ $i_3$ $i_4$ $i_5$ $i_6$ $i_7$ $i_8$ $i_9$ $i_{10}$

Difference
$(i_1-i_2)$ $(i_2-i_3)$ $(i_3-i_4)$ $(i_4-i_5)$ $(i_5-i_6)$ $(i_6-i_7)$ $(i_7-i_8)$ $(i_8-i_9)$ $(i_9-i_{10})$ Sign given to difference
+ − − − + + + − −

As Allocated $i_A$ l.16
$\qquad\qquad -(i_3-i_4) \qquad (i_5-i_6) \qquad\qquad -(i_9-i_{10})$ $i_B$ l.16
$\qquad\qquad\qquad\qquad (i_6-i_7) \qquad (i_8-i_9)$ $i_C$ l.16
$(i_1-i_2) \quad -(i_2-i_3)$ According to mode #1, Table I shows for each time interval whether $V_{AO}$, $V_{BO}$, $V_{CO}$ is a ONE or a ZERO.

Where one phase line is sole-connected, as $V_{BO}$ at time intervals 1, 3, 7, or as $V_{AO}$ at time intervals 6, 10 or 12, the sample derived from line 11 represents the associated motor line AC current ($i_B$ for $V_{BO}$, $i_A$ for $V_{AO}$ in the two aforestated illustrations). The pole sign is − for $V_{BO}$ in these instances (configuration of FIG. 5C), it is + for $V_{AO}$ (configuration of FIG. 5F). Accordingly, the sample is $-i_B$ for phase B sole-connected in those intervals 1, 3, 7, and the sample is $+i_A$ for phase A sole-connected in those intervals 6, 10 or 12. The value of the sample is stored and outputted on the corresponding line, line 17 for $-i_B$, line 16 for $+i_A$. The "all co-connected situations of intervals 2, 5, 8, ... are ignored, where the sample is at level zero.

According to mode #2, Table II shows a change of status upon the edge of $V_{AO}$, $V_{BO}$, $V_{CO}$ when the particular configuration changes, e.g. from one time interval to the next. Thus $V_{BO}$ as sole-connected phase goes from a ZERO to a ONE between time intervals 1 and 2, and from a ONE to a ZERO between time intervals 2 and 3. Sampling before and after the change provides samples $i_1$, $i_2$, $i_3$ successively. The differences are $(i_1 - i_2)$; $(i_2 - i_3)$; etc ... between two adjacent time intervals, e.g. between two successive sampling instants. The sign rule is + when the sole-connected phase goes from a ZERO to a ONE, and conversely, it is − when the sole-connected phase goes from a ONE to a ZERO. Accordingly, $i_B = (i_1 - i_2)$ for the transition, or edge, from interval 1 to interval 2, it is $-i_B = -(i_2 - i_3)$ for the transition, or edge, from interval 2 to interval 3. Again $i_B$ is stored and outputted on line 17 in accordance with the sole-connected nature of phase B for such time intervals.

The invention is applicable in all instances where a voltage-source inverter pulse-width modulated power supply requires to know the outputted AC currents $I_A$, $I_B$, $I_C$, separately or concurrently. The invention lends itself most advantageously to digital treatment in a microprocessor-based pulse-width modulated AC power supply or in other digitally controlled pulse-width modulated systems, such as the system described for a motor drive by Applicant in U.S. Pat. No. 4,099,109. For the purpose of this description, this patent is hereby incorporated by reference. In all instances of a PWM motor drive requiring the instantaneous determination of the motor line currents, the invention will be readily applicable. This is the case of variable-speed electric machine drive system described in "A High-Performance Torque Controller Using a Voltage Source Inverter and Induction Machine" by G. A. Kaufman and Allan B. Plunkett in IAS81:35A pp. 863–872 (IEEE 1981). Other examples are U.S. Pat. Nos. 4,387,421 and 3,819,992. For the purpose of illustrating control of the motor drive using signals representative of the AC currents thereof, U.S. Pat. No. 3,909,968 is hereby incorporated by reference.

Figure 10:
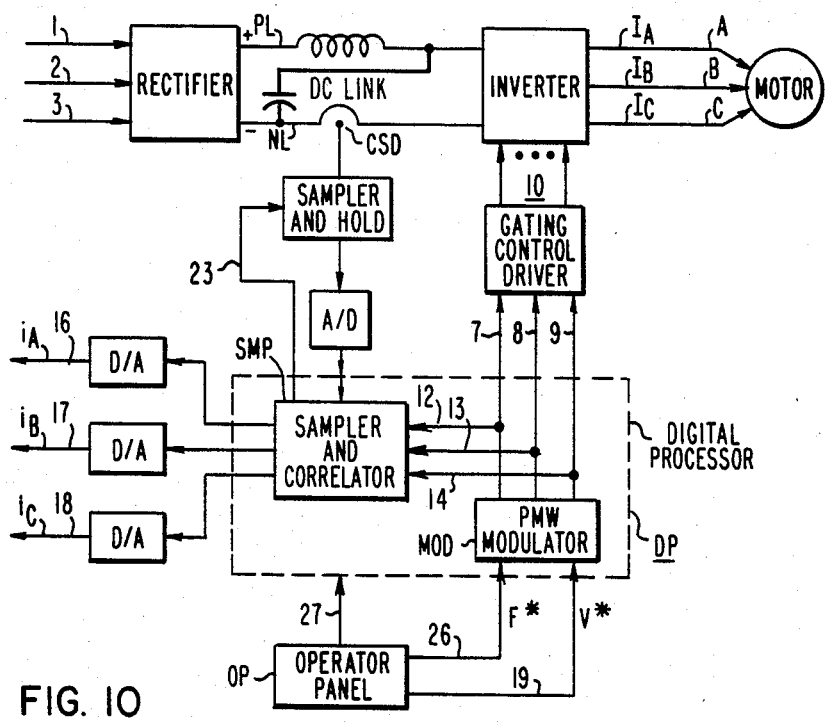
FIG. 10 illustrates the implementation of the invention with a digital processor performing the sampling and correlation functions involved therein.

Referring to FIG. 10, it is assumed that a Hall-effect device is used as the current sensor CSD and that a sample and hold device SH inserted on line 11 provides the desired sample at any sampling instant defined by the clock via line 23. The sample is digitalized by an A/D converter. The pulse-width modulator MOD is part of a digital processor DP as explained in the Abbondanti patent. The ZERO and ONE states of lines 7, 8, 9 appear as such on line 12, 13, 14 to define at any time interval one of the configurations of FIGS. 5A–5H. From the operator panel OP the operator defines the motor drive operation, via line 27 to the digital processor, via lines 26, and 19 to the pulse-width modulator MOD, where line 26 establishes a reference frequency F* and line 19 establishes a reference voltage V*.

Figure 11:
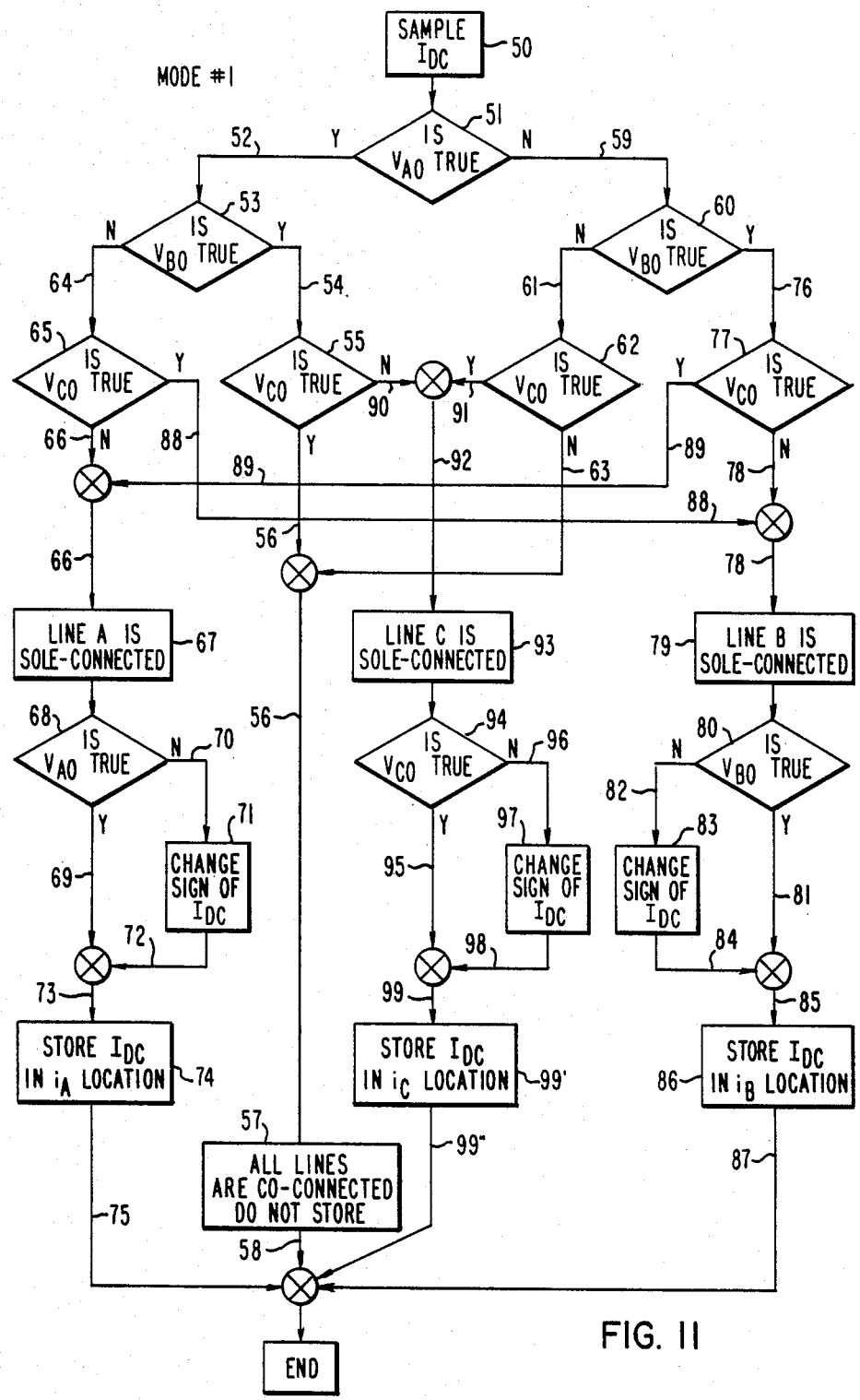
FIG. 11 is a flow chart illustrating the operation of the apparatus of FIG. 8.

The operation of the sampler and correlator will now be explained by reference to FIG. 11 which is a flow chart applicable to mode #1. A sample taken on $I_{DC}$ from the current sensor CSD is derived at 50 at the sampling instant. At this point the question is raised at 51 whether $V_{AO}$ is true, e.g. whether for line A the switch is connected to terminal PL or to terminal NL (configuration of FIG. 5F, or of FIG. 5B). If the answer is YES, by line 52 the question at 53 is raised whether $V_{BO}$ is true (configuration of FIG. 5G or of FIG. 5C). If the answer at 53 is YES, by 54 the system goes to 55 where the same question is raised for $V_{CO}$ (configuration 5E or configuration 5D). If the answer at 55 is YES again, by 56 the system goes to 57 where the conclusion is that all lines are co-connected, and the decision is not to store the $I_{DC}$ sample. The test ends by line 58.

If the answer at 51 is that $V_{AO}$ is not true (the configuration is as in FIG. 5B rather than FIG. 5F if it were true), by line 59 the system goes to 60 where the same question is raised as to $V_{BO}$. If the answer is NO (configuration 5C rather than 5G) by 61 the question becomes at 62 whether $V_{CO}$ is true. If the answer is again NO (configuration 5D rather than 5C) by line 63 the system follows again line 56 to the conclusion reached at 57 that all lines are co-connected, and that the $I_{DC}$ sample should not be stored.

If the answer at 51 and at 53 for $V_{AO}$ and $V_{BO}$ is YES, but NO at 55 for $V_{CO}$, by lines 90 and 92 the system goes to block 93 where the conclusion is that line C is sole-connected. Then, at 94 the answer to whether $V_{CO}$ is true is confirmed, whereby a NO by line 96 leads at 97 to order a change of sign for the $I_{DC}$ sample, and by lines 98, 99 the system goes to 99' where the $I_{DC}$ sample with such change of sign is stored into the $i_C$ location of the digital processor register. By line 99'' the present test is ended.

If the answer is NO at 51 and 60 for $V_{AO}$ and $V_{BO}$, respectively, but the answer at 62 is YES for $V_{CO}$, then by lines 91 and 92 the conclusion is reached at 93 that line C is sole-connected. Then, at 94 the status of the switch related to $V_{CO}$ is confirmed as being a YES. The conclusion derived by line 95 bypasses the change of sign of block 97, and by line 99 the system goes to block 99' where the decision as to store the $I_{DC}$ sample without a change of sign into location $i_C$.

What has just been said for location $i_C$ can be said for locations $i_A$ and $i_B$. For instance, storage of the $I_{DC}$ sample in the $i_A$ location occurs by block 74 in response to line 69 is $V_{AO}$ is true, with a change of sign at 71 if $V_{AO}$ is not true (by lines 70 and 72). This series of steps is performed when $V_{AO}$ and $V_{CO}$ are not true at 53 and 65, or when $V_{AO}$ is not true at 51 but $V_{BO}$, $V_{CO}$ are true at 60 and 77. All the remaining situations are easily derived from FIG. 11 by analogy.

Figure 12:
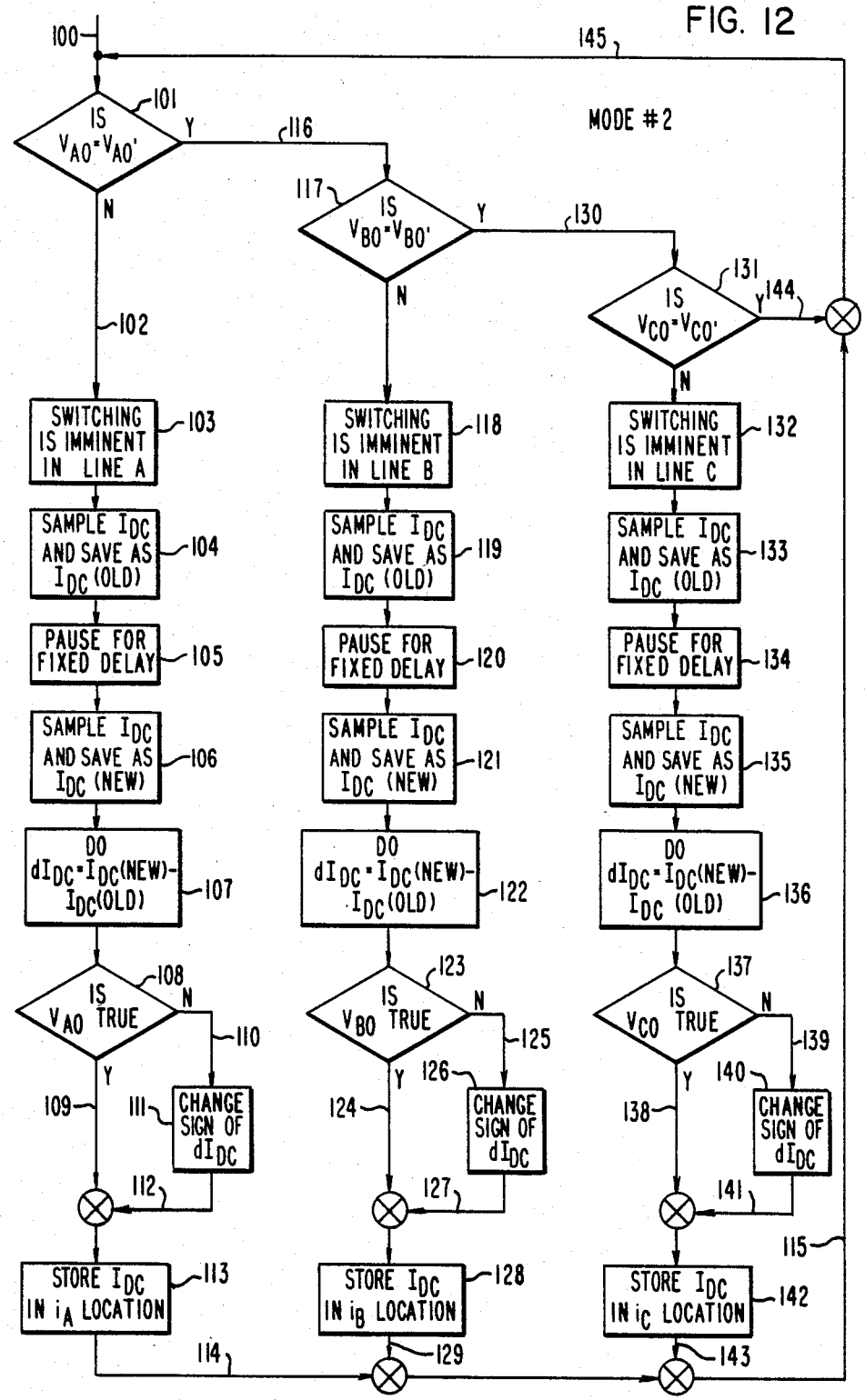
FIG. 12 is a flow chart illustrating the operation of the apparatus of FIG. 9.

Referring to FIG. 12 the operation of the sampler and correlator in a mode #2 implementation will now be explained.

The $I_{DC}$ sample is no longer automatically derived. By line 100 a first location takes place with the clock, going to 101 where the question is whether $V_{AO} = V_{AO}'$. If it is not, the conclusion, reached at 103 by line 102 is that switching is imminent in line A. Then at 104 sampling is effected and the sampled value stored as $I_{DC}$ (OLD). Thereafter, at 105 a pause is observed with a fixed delay as defined by the delay circuit DLC of FIG. 9. After such delay has elapsed, at 106 another sampling is effected and the sampled value is stored as $I_{DC}$ (NEW). The next step is at 107, where the command is "$D_O dI_{DC} = I_{DC}(\text{NEW}) - I_{DC}(\text{OLD})$"$= i_A$. Then, at 108 the question is whether $V_{AO}$ is true. If YES, by 109, the system goes to 113 where the value derived at 107 is stored in the $i_A$ location. If the answer at 108 is NO, by line 110 the decision becomes at 111 to change the sign of the difference derived at 107, and by 112 it is at 113 stored with such change of sign at location $i_A$. If the conclusion is NO at 101, the system goes to 117 where the question is whether $V_{BO} = V_{BO}'$ or by line 130 to 132 where the question is whether $V_{CO} = V_{CO}'$. If the answer is NO at 117 a line parallel to line 102 goes all the way to 128 where a difference between $I_{DC}(\text{NEW})$ and $I_{DC}(\text{OLD})$ (resulting from samples effected at 119 for $I_{DC}(\text{OLD})$ and at 121 for $I_{DC}(\text{NEW})$) is stored with or without a change of sign depending upon whether at 123 $V_{BO}$ is NO or not storing in the $i_B$ location. The same can be said if the answer is NO at 13, for the parallel branch of the flow chart going from block 132 to block 142 for the $i_C$ location. If at 144 the conclusion is reached that none of the delayed signals $V_{AO}'$, $V_{BO}'$ and $V_{CO}'$ are different from their corresponding non-delayed counterpart $V_{AO}$, $V_{BO}$ and $V_{CO}$, it can be inferred that no switching event is imminent. The system then loops back via 145 to 100 where the interrogation process of the delayed and non-delayed pole status signals is re-iterated.

Although the invention has been described in the context of PWM modulation motor drive, the sampling method and apparatus according to the invention is also applicable in the case of a motor drive in which the inverter is controlled in accordance with the reference frequency for the AC motor current supply but with no pulse width modulation, the voltage of the outputted AC current being adjusted separately by controlling the magnitude of voltage of the DC voltage source. This type of motor drive is known as adjustable votlage input (AVI) inverter motor drive.

What I claim is:

1. In a voltage-source inverter AC power supply including a voltage-source, an inverter and a DC link passing DC current from said voltage-source to said inverter, said inverter having a plurality of power switches controlled in accordance with a modulation pattern for outputting AC currents on polyphase AC lines, the method of deriving a signal representative of at least one of said AC currents comprising the steps of:
   deriving from said DC link sample representative of said DC current during successive sampling instants;
   deriving a logic representation of the actual switching status of said power switches between an ON and an OFF status in accordance with said pattern for each said sampling instant;
   correlating a succession of said DC current samples with a corresponding one of said AC currents in accordance with said actual switching status logic representation; and
   deriving said representative signal in relation to said succession of DC current samples.

2. The power supply of claim 1 with the further step of determining for said derived representative signal and upon such related sampling instant a "sole-connected" switching status for the AC line associated to said one AC current and relative to one of the poles of said DC link, said derived representative signal being given a sign in accordance with the polarity of said one pole.

3. The power supply of claim 1 with consecutive said sampling instants being established one before, the other after the occurrence of a change of status in said actual switching status of said power switches, with the additional step of determining the difference between the DC current samples of said consecutive sampling instants; said correlating step being performed with each such differences in the succession of said consecutive sampling instants, thereby to derive said representative signal.

4. The power supply of claim 3 with the further step of determining for said representative signal and related difference, a "sole-connected" switching status for the AC line associated with said one AC current and relative to one of the poles of said DC link, said derived representative signal being given a sign in accordance with the polarity of said one pole.

5. The power supply of claim 1 with the step of determining when a switching status change establishes an "all co-connected" status for said AC lines relative to a single one of said DC link poles and when a switching status change occurs between two "sole-connected" status relative to one of said DC link poles;
   said sampling instants being established consecutively one before, the other after said switching status change occurring between two "sole-connected" status to derive a first and a second direct current sample, with the step of assigning to said first and second direct current samples a sign in accordance with the corresponding one polarity;
   with the step of adding said first and second samples to derive a third sample, and with said representative signal being derived with said first, second and third samples to provide a representative of first, second and third AC currents.

6. The power supply of claim 1 with said sampling instant coinciding with a change of status in said power switches, said DC link samples deriving step being performed with a transformer coupled with said DC link.

7. The power supply of claim 6 with a restorer circuit being associated with said transformer, said restorer circuit being controlled to charge-up under the direct current of said DC link when the status of said power switches corresponds to said AC lines being "all co-connected" to a single one of the DC link poles.

8. In a pulse width modulation (PWM) motor drive including a voltage source an inverter, a DC link coupled therebetween, an induction motor having motor lines supplied with AC current from said inverter, said inverter having power switches controlled by a pulse-width modulator in accordance with successive switching patterns establishing connections between the poles of said DC link and the motor lines, the combination of:
   means for sampling the direct current flowing in said DC link at predetermined sampling instants and for deriving direct current samples;
   means responsive to said pulse-width modulator for relating said derived direct current samples to a corresponding motor line AC current in accordance with a concurrent switching pattern; and
   means for deriving said direct current samples in response to said relating means successively as a signal representation of such corresponding motor line AC current.

9. The motor drive of claim 8 with said sampling instants corresponding to a switching pattern by which said corresponding motor line AC current flows in a motor line which is "sole-connected" to one pole of said DC link.

10. The motor drive of claim 9 with the corresponding direct current sample being given a sign corresponding to said one pole.

11. The motor drive of claim 8 with two consecutive said sampling instants being one before, the other after a change of switching pattern, means being provided for subtracting one direct current sample from the other between such consecutive sampling instants and for deriving a difference signal as a corresponding motor line AC current.

12. The motor drive of claim 11 with said difference signal being given a sign corresponding to the DC link polarity associated with the motor line which is "sole-connected" upon said other consecutive sampling instant.

13. The motor drive of claim 8 with means responsive to said pulse-width modulator for establishing when the AC current motor lines are "all co-connected" to one pole of DC link and when an AC current motor line is "sole-connected";

with said sampling instants being established by pairs consecutively one before the other after a switching pattern change occurring between two "sole-connected" patterns to derive a first and a second direct current sample;

with means for adding said first and second samples to derive a third sample;

said direct current sample deriving means being responsive to said first, second and third samples for providing signals representative of said motor line AC currents respectively.

14. The motor drive of claim 11 with said sampling means including a current transformer coupled with said DC link.

15. The motor drive of claim 14 with a DC restorer circuit being associated with said transformer, said DC restorer circuit being controlled to charge up under said DC direct current of said DC link when said switching pattern corresponds to said motor lines being "all co-connected" to one pole of said DC link.

16. The motor drive of claim 8 with means responsive to said AC current signal representation for controlling the operation of said motor.

17. In a voltage-fed adjustable voltage adjustable frequency AC induction motor drive including a controllable DC voltage source, a frequency controlled inverter, a DC link coupled therebetween, an induction motor having motor lines supplied with AC current from said inverter, said inverter having power switches assuming at any instant one of an on and an off status between the poles of said DC link and a corresponding motor line;

means for controlling said power switches in accordance with successive switching patterns establishing connections between the poles of said DC link and the motor lines, the combination of:

means for sampling the direct current flowing in said DC link at predetermined sampling instants and for deriving direct current samples;

means responsive to said controlling means for relating said derived direct current samples to a corresponding motor line AC current in accordance with a concurrent switching pattern; and means for deriving said direct current samples in response to said relating means successively as a signal representation of such corresponding motor line AC current.

18. The motor drive of claim 17 with said sampling instants corresponding to a switching pattern by which said corresponding motor line AC current flows in a motor line which is "sole-connected" to one pole of said DC link.

19. The motor drive of claim 18 with the corresponding direct current sample being given a sign corresponding to said one pole.

20. The motor drive of claim 19 with two consecutive said sampling instants being one before, the other after a change of switching pattern, means being provided for subtracting one direct current sample from the other between such consecutive sampling instants and for deriving a difference signal as a corresponding motor line AC current.

21. The motor drive of claim 20 with said difference signal being given a sign corresponding to the DC link polarity associated with the motor line which is "sole-connected" upon said other consecutive sampling instant.

22. The motor drive of claim 20 with said sampling means including a current transformer coupled with said DC link.

23. The motor drive of claim 17 with means responsive to said AC current signal representation for controlling the operation of said motor.

* * * * *